(12) United States Patent
Folker et al.

(10) Patent No.: US 9,980,396 B1
(45) Date of Patent: May 22, 2018

(54) LOW PROFILE MAGNETIC COMPONENT APPARATUS AND METHODS

(75) Inventors: Donald Folker, Madison, AL (US); Ted Kluska, Madison, AL (US); Mike LeBlanc, Huntsville, AL (US)

(73) Assignee: UNIVERSAL LIGHTING TECHNOLOGIES, INC., Madison, AL (US)

( * ) Notice: Subject to any disclaimer, the term of this patent is extended or adjusted under 35 U.S.C. 154(b) by 1543 days.

(21) Appl. No.: 13/008,708

(22) Filed: Jan. 18, 2011

(51) Int. Cl.
*H05K 5/00* (2006.01)
*H05K 1/00* (2006.01)
*H01F 3/00* (2006.01)
*H01F 29/00* (2006.01)
*H01F 27/30* (2006.01)

(52) U.S. Cl.
CPC .............. *H05K 5/00* (2013.01); *H05K 1/00* (2013.01); *H01F 3/00* (2013.01); *H01F 27/306* (2013.01); *H01F 29/00* (2013.01)

(58) Field of Classification Search
USPC ........ 361/752, 93.5, 744; 333/177; 335/297; 336/5, 61, 83, 90, 92, 96, 110, 160, 177, 336/178, 180, 189, 192, 198, 212, 233
See application file for complete search history.

(56) References Cited

U.S. PATENT DOCUMENTS

| | | | |
|---|---|---|---|
| 2,869,087 A | 1/1959 | Sontheimer | |
| 3,209,294 A | 9/1965 | Cornell | |
| 3,355,689 A | 11/1967 | Paddison et al. | |
| 3,371,301 A | 2/1968 | Hisano | |
| 4,352,080 A * | 9/1982 | Mitsui et al. | 336/83 |
| 4,352,081 A | 9/1982 | Kijima | |
| 4,424,504 A * | 1/1984 | Mitsui et al. | 336/83 |
| 4,760,366 A * | 7/1988 | Mitsui | 336/233 |
| 4,980,664 A * | 12/1990 | Harwood | 336/192 |
| 5,034,854 A * | 7/1991 | Matsumura et al. | 361/744 |
| 5,088,186 A * | 2/1992 | Boesel | 29/605 |
| 5,140,291 A | 8/1992 | Mulder et al. | |
| 5,157,368 A * | 10/1992 | Okano et al. | 336/90 |
| 5,194,841 A * | 3/1993 | Galloway et al. | 336/92 |

(Continued)

*Primary Examiner* — Xiaoliang Chen
(74) *Attorney, Agent, or Firm* — Patterson Intellectual Property Law, P.C.; Gary L. Montle; Grant M. Ford (57) ABSTRACT

A magnetic component for an electronic circuit includes a core having a core body and a core leg extending from the core body. The core body defines a core body height, and the core leg defines a core leg height less than the core body height. A conductive winding is positioned about the core leg. The winding defines a winding height. A winding height offset ratio is defined as the winding height divided by the core body height. In some embodiments the winding height offset ratio is less than about 1.1. The winding can be positioned on a bobbin structure disposed about the core leg. The magnetic component can be positioned in an enclosure to form an electronic device such as a power control or a power supply, and a thermally conductive gap-filler can be positioned between the magnetic component and the enclosure wall to dissipate heat from the magnetic component. The reduced height of the core leg provides a reduced gap distance between the core body and the enclosure wall for improving heat transfer, reducing thermal gap-filler material volume and reducing enclosure size. A method of forming an electronic device is also provided.

13 Claims, 5 Drawing Sheets

(56) References Cited

U.S. PATENT DOCUMENTS

| | | | |
|---|---|---|---|
| 5,210,513 A * | 5/1993 | Khan et al. | 336/61 |
| 5,266,916 A * | 11/1993 | Kijima | 336/160 |
| 5,359,313 A * | 10/1994 | Watanabe et al. | 336/178 |
| 5,521,573 A * | 5/1996 | Inoh et al. | 336/180 |
| 5,524,334 A | 6/1996 | Boesel | 29/605 |
| 5,534,839 A * | 7/1996 | Mackin et al. | 336/192 |
| 5,726,616 A * | 3/1998 | Bell | 336/92 |
| 5,760,669 A | 6/1998 | Dangler et al. | |
| 5,760,670 A | 6/1998 | Yeh et al. | |
| 5,996,214 A * | 12/1999 | Bell | 29/605 |
| 6,002,318 A | 12/1999 | Werner et al. | |
| 6,211,765 B1 | 4/2001 | Ito et al. | |
| 6,326,874 B1 * | 12/2001 | Banzi et al. | 336/192 |
| 6,344,786 B1 * | 2/2002 | Chin | 336/198 |
| 6,344,787 B1 * | 2/2002 | McGrane et al. | 336/198 |
| 6,501,362 B1 * | 12/2002 | Hoffman et al. | 336/198 |
| 6,696,913 B2 | 2/2004 | Meuche et al. | |
| 6,791,839 B2 | 9/2004 | Bhagwagar | |
| 7,078,997 B2 * | 7/2006 | Toyomura | 336/192 |
| 7,088,211 B2 | 8/2006 | Moncada et al. | |
| 7,271,694 B2 | 9/2007 | Chang | |
| 7,345,566 B2 | 3/2008 | Urano | |
| 7,528,694 B2 * | 5/2009 | Tseng et al. | 336/212 |
| 7,598,837 B2 * | 10/2009 | Gilmartin et al. | 336/192 |
| 7,598,839 B1 * | 10/2009 | Wedley | 336/212 |
| 7,701,320 B2 | 4/2010 | Iwakura et al. | |
| 7,710,230 B2 * | 5/2010 | Hsueh et al. | 336/92 |
| 7,855,625 B2 * | 12/2010 | Varga et al. | 336/90 |
| 8,217,746 B2 * | 7/2012 | Kitajima et al. | 336/178 |
| 2002/0097126 A1 * | 7/2002 | Fujiwara et al. | 336/110 |
| 2002/0097127 A1 * | 7/2002 | Fujiwara et al. | 336/178 |
| 2002/0109571 A1 * | 8/2002 | Fujiwara et al. | 336/178 |
| 2002/0163413 A1 * | 11/2002 | Holdahl et al. | 336/192 |
| 2003/0080844 A1 * | 5/2003 | Nishikawa et al. | 336/178 |
| 2003/0116746 A1 * | 6/2003 | Sezai et al. | 252/62.62 |
| 2003/0201859 A1 * | 10/2003 | Ichikawa | 336/5 |
| 2004/0004799 A1 * | 1/2004 | Elder | 361/93.5 |
| 2004/0090300 A1 | 5/2004 | Meuche et al. | |
| 2004/0100347 A1 * | 5/2004 | Okamoto | 336/83 |
| 2004/0150501 A1 * | 8/2004 | Hoffman et al. | 336/198 |
| 2004/0207500 A1 * | 10/2004 | Fujiwara et al. | 336/178 |
| 2005/0046534 A1 * | 3/2005 | Gilmartin et al. | 336/83 |
| 2005/0140485 A1 * | 6/2005 | Chang | 336/198 |
| 2005/0174816 A1 * | 8/2005 | Nishikawa et al. | 363/83 |
| 2006/0028302 A1 * | 2/2006 | Urano | 333/177 |
| 2006/0244561 A1 | 11/2006 | Iwakura et al. | |
| 2007/0057756 A1 | 3/2007 | Yang | |
| 2008/0024255 A1 * | 1/2008 | Sano | 335/297 |
| 2008/0100407 A1 * | 5/2008 | Yamaguchi et al. | 336/192 |
| 2009/0009276 A1 * | 1/2009 | Jidaisho | 336/90 |
| 2009/0115561 A1 * | 5/2009 | Brinlee et al. | 336/198 |
| 2009/0237193 A1 * | 9/2009 | Wedley | 336/83 |
| 2010/0026438 A1 * | 2/2010 | Gilmartin et al. | 336/192 |
| 2010/0026441 A1 * | 2/2010 | Wedley | 336/221 |
| 2010/0123537 A1 * | 5/2010 | Yamada et al. | 336/192 |
| 2010/0207714 A1 * | 8/2010 | Lai et al. | 336/61 |
| 2011/0102119 A1 * | 5/2011 | Tsai et al. | 336/192 |

* cited by examiner

LOW PROFILE MAGNETIC COMPONENT APPARATUS AND METHODS

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: None.

STATEMENT REGARDING FEDERALLY SPONSORED RESEARCH OR DEVELOPMENT

Not Applicable.

REFERENCE TO SEQUENCE LISTING OR COMPUTER PROGRAM LISTING APPENDIX

Not Applicable.

BACKGROUND OF THE INVENTION

The present invention relates generally to magnetic circuit components and more particularly to magnetic components for mounting on a circuit board housed within an enclosure. The present invention also relates to enclosed electronic devices.

Magnetic components including a magnetically permeable core and one or more conductive windings positioned near the core are known in the art. Such components are used in conventional inductors and transformers in a variety of electronic applications. Magnetic components of this type can generally be configured for surface mounting on a circuit board for use in an electrical circuit. Common applications for such devices include power supplies and power regulators for electrical lighting applications. Typically, in these applications, the circuit board and electronic components disposed thereon are housed within an enclosure.

Some conventional magnetic components configured for mounting on a circuit board generally include a core structure having one or more core legs extending outward from a core body. Each core leg has a leg height, a leg length and a leg width. A conductive winding including one or more turns of a conductive wire can be positioned around any one or more of the core legs. In some conventional applications, primary and secondary windings are positioned around a core leg to form a transformer. In many conventional applications, the conductive winding or windings are positioned first on a bobbin structure, or coil former. The bobbin structure includes an axial opening, and a core leg can be inserted into the axial opening such that the bobbin structure and the conductive coil both surround the core leg.

Figure 1:
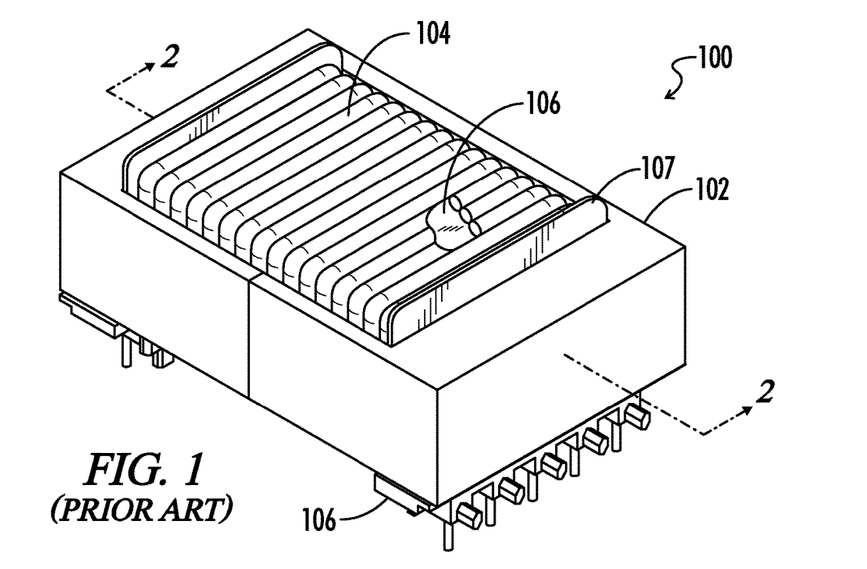
FIG. 1 illustrates a partially broken-away perspective view of a conventional magnetic component.
Figure 2:
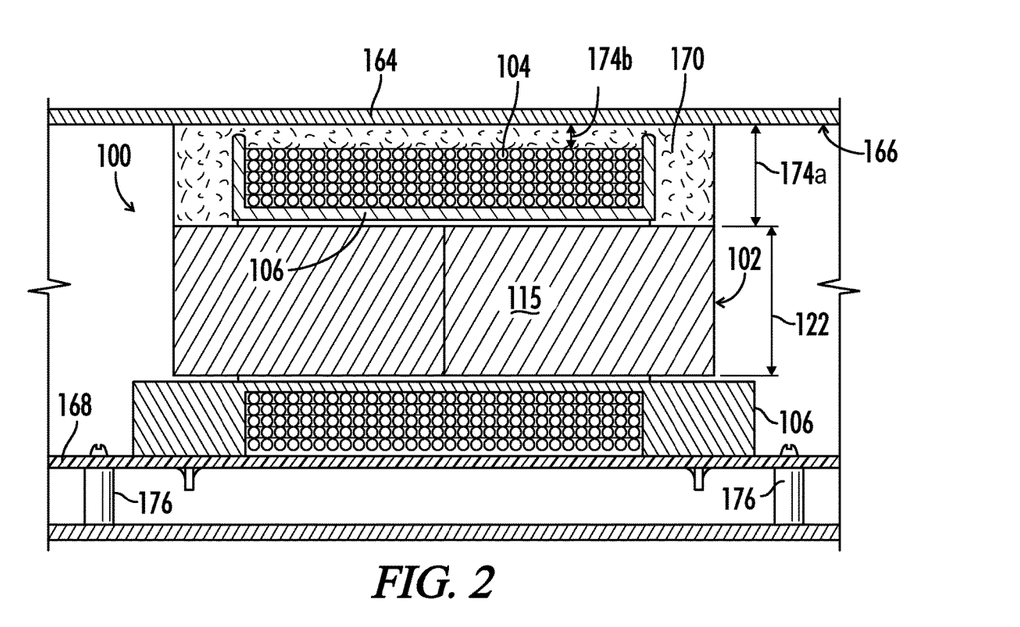
FIG. 2 illustrates an elevation view of the conventional magnetic component of FIG. 1 positioned below an enclosure wall and defining a core gap between the core and the enclosure wall.

FIG. 1 illustrates a conventional magnetic component including a core 102 and a bobbin structure 106. A conductive winding 104 is positioned around the bobbin structure 106. The core 102 illustrated in the conventional magnetic component 100 in FIG. 1 is a standard E-core having a middle core leg of substantially the same height as the core body and the outer core legs. The bobbin 106 also includes a bobbin end flange 107. FIG. 2 illustrates a cross-sectional view of Section 2-2 from FIG. 1, showing a conventional magnetic component 100 mounted on a circuit board 168 inside an enclosure 164 to form an electronic device.

Because magnetic circuit components in electronic devices generate heat during use, it is generally desirable to dissipate heat away from such components to ensure proper operation and to reduce the risk of component failure or fire inside the enclosure. However, close proximity between magnetic circuit components and enclosure walls in compact electronic devices can make efficient heat dissipation difficult to achieve.

Additionally, in many electronic applications, a magnetic component such as an inductor or transformer forms the tallest circuit component mounted on a circuit board in an electronic device. Thus, any enclosure formed to surround the circuit board must include an interior height sufficient to accommodate the height of the tallest circuit component, i.e. the transformer or inductor. Additionally, the growing trend of miniaturization in the electronics industry seeks to reduce the electronic device profile of enclosed circuit boards, resulting in narrow spaces between inner enclosure walls and the surfaces of magnetic components mounted on the circuit board housed within the enclosure. Thus, it is desirable to produce magnetic components with reduced profile for reducing electronic device size. However, the goal of miniaturizing electronic devices by reducing the space between components and enclosure walls can make the goal of efficient heat dissipation more difficult to achieve.

Others have tried to address the problem of dissipating heat from conventional magnetic components by providing a thermal gap-filler, or bonding material between the magnetic component and the enclosure wall. By thermally connecting the magnetic component to the enclosure wall, the enclosure wall can act as a heat sink to dissipate heat. Heat generated in the magnetic component transfers from the core through the thermal gap-filler into the enclosure wall, where the heat can be further dissipated to the surrounding environment or to heat dissipation structures such as cooling fins. Heat can then be removed from the enclosure or cooling fins by natural or forced convection and/or radiation to the ambient environment.

Referring again to the conventional configuration illustrated in FIG. 2, a gap is defined between the core 102 and the interior enclosure surface 166 of enclosure wall 164. The gap can be filled with a thermally conductive gap-filler 170. The gap-filler 170 provides a thermal bridge for heat flux to pass from the magnetic component 100 to the enclosure 164. However, because the conductive winding 104 and bobbin structure 106 extend above the core 102, as seen in FIG. 2, gap-filler 170 includes at least two thicknesses. A first gap filler thickness 174a extends between the interior enclosure surface 166 and the core 102. A second gap-filler thickness 174b extends between the interior enclosure surface 166 and the conductive winding 104. The conventional configuration requiring multiple gap-filler thicknesses can provide inadequate heat dissipation because the thermal resistance is increased between core 102 and enclosure 164 through the greater second gap-filler thickness 174b. Additionally, much of the heat generated by the magnetic component 100 is present in the core 102. Thus, the excessive distance between core 102 and enclosure 164 prevents optimal heat dissipation. Further, the height to which conductive winding 104 and bobbin structure 106 extend above core 102 prevents reduction in the electronic device profile.

What is needed, then, is an improved magnetic component for an electronic circuit for dissipating heat from the magnetic component. Also needed is an improved electronic device having improved heat dissipation and reduced electronic device profile. Additionally, methods of manufacture associated with the improved magnetic component and electronic device are also needed.

BRIEF SUMMARY OF THE INVENTION

The present invention provides an improved magnetic component having a reduced height middle core leg for reducing the distance the winding extends above the core body. The present invention also includes an improved electronic device having a magnetic component mounted to a circuit board inside an enclosure. Additionally, the present invention provides a method of manufacturing an electronic device having a reduced device profile and improved heat transfer between a magnetic component housed within the enclosure and the enclosure wall.

One aspect of the present invention provides a magnetic component apparatus for an electronic circuit. The component includes a core having a core body and a core leg protruding from the core body. The core body defines a core body height. The core leg defines a core leg height, and the core leg height is less than the core body height. A conductive winding is positioned about the core leg. The conductive winding defines a winding height. The winding height defines a winding height offset ratio equal to the winding height divided by the core body height, and the winding height offset ratio is less than about 1.1 in some embodiments.

Another aspect of the present invention provides an electronic device. The electronic device includes a circuit board. A magnetic component is mounted on the circuit board. The magnetic component includes a core and a conductive winding disposed about the core. The core further includes a core body defining a core body height and a core leg extending from the core body. The core leg defines a core leg height less than the core body height. A bobbin structure defines an axial opening, and the core leg is positioned in the axial opening. A conductive winding is disposed about the bobbin structure. The conductive winding defines a winding height, the winding height being less than the core body height.

In a further embodiment, the present invention provides a method of forming an electronic device. The method includes the steps of: (a) providing a magnetic component having a core body and a core leg protruding from the core body, the core leg having a core leg height and the core body having a core body height, the core leg height being less than the core body height; (b) positioning a conductive winding about the core leg; (c) positioning the magnetic component in an enclosure having an interior enclosure surface; and (d) bonding the magnetic component to the interior enclosure surface using a thermally conductive gap-filler material disposed between the interior enclosure surface and the magnetic component.

Numerous other objects, features and advantages of the present invention will be readily apparent to those skilled in the art upon a reading of the following disclosure when taken in conjunction with the accompanying drawings.

DETAILED DESCRIPTION OF THE INVENTION

Figure 3:
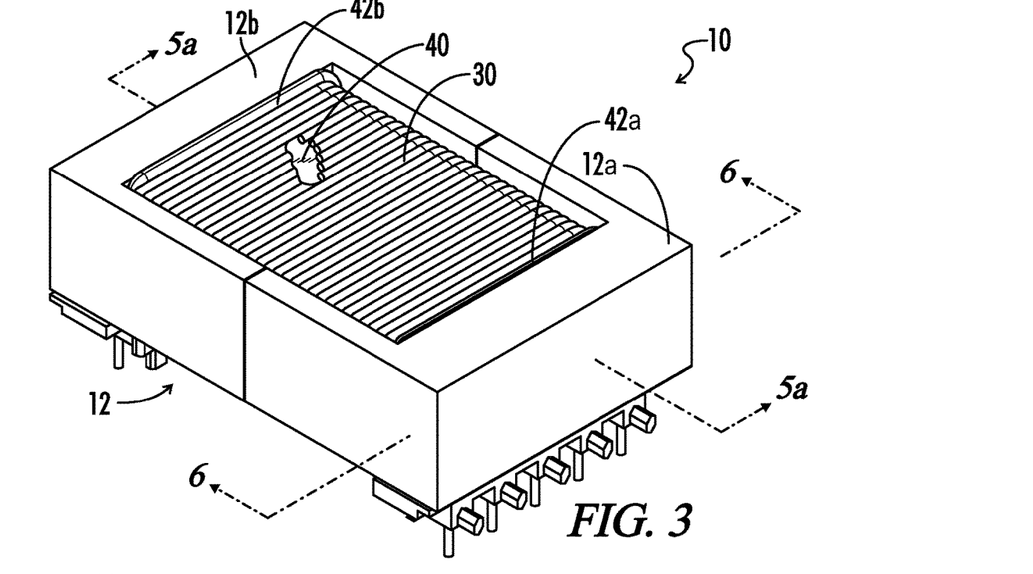
FIG. 3 illustrates a partially broken-away perspective view of an embodiment of a magnetic component in accordance with the present invention.

Referring further to the drawings, FIG. 3 illustrates a magnetic component in accordance with the present invention generally designated by the numeral 10. The magnetic component 10 includes a core 12. In some embodiments, the core 12 includes one or more core sections. For example, as seen in FIG. 3, core 12 includes a first core section 12a and a second core section 12b. One or both core sections 12a, 12b can include a standard or modified E-core or other suitable type of core shape known in the art. Core 12 generally includes a magnetically permeable material. In some embodiments, core 12 includes a ferrite.

Figures 4A, 4B:
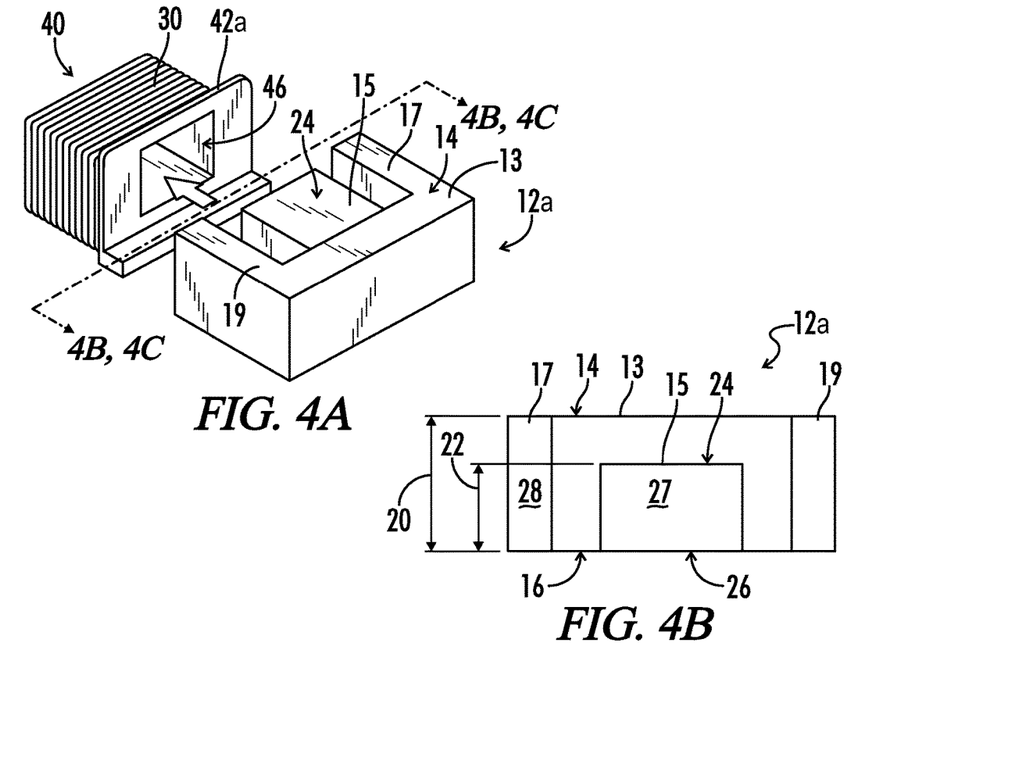
FIG. 4A illustrates an exploded partial perspective view of an embodiment of a core, bobbin structure and conductive winding in accordance with the present invention.
FIG. 4B illustrates a side elevation view of an embodiment of the core from FIG. 4A.

Core 12, or a core section 12a as seen in FIG. 4A, includes a core body 13 and a core leg 15 protruding from the core body 13. In some embodiments, core body 13 includes a first outer leg 17 and a second outer leg 19, and the core leg 15 extends between the first and second outer legs 17, 19. The core leg 15 can have a rectangular cross-sectional profile, as seen in FIG. 4A. In other embodiments not shown, core leg 15 can have a rounded or irregular cross-sectional profile. In some embodiments, core leg 15 has a circular or oval shape, and first and second outer legs 17, 19 have rectangular shapes.

Referring now to FIG. 4A and FIG. 4B, in some embodiments, core body 13 defines a core body height 20, and core leg 15 defines a core leg height 22. The core leg height 22 is less than the core body height 20. In some embodiments, core body 12 defines an upper core body surface 14, seen in FIG. 4A, and a lower core body surface 16, seen in FIG. 4B. Upper and lower core body surfaces 14, 16 can be substantially flat or can include a curved or textured profile. Core body height 20 can be defined as the distance between lower core body surface 16 and upper core body surface 14. Similarly, core leg 14 in some embodiments includes an upper core leg surface 24 and a lower core leg surface 26. Core leg height 22 can be defined as the distance between upper core leg surface 24 and lower core leg surface 26. In the embodiment illustrated in FIG. 4B, lower core leg surface 26 is coextensive with lower core body surface 16. Generally, core leg height 22 is less than core body height 20.

Figure 4C:
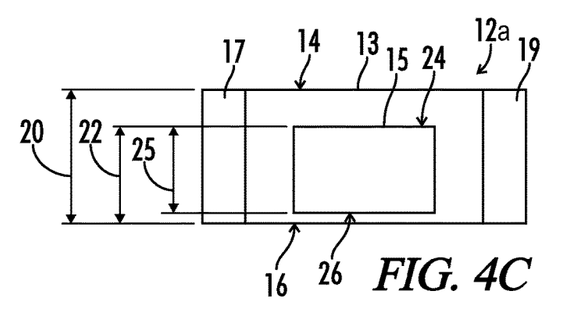
FIG. 4C illustrates a side elevation view of an embodiment of the core from FIG. 4A.

In another embodiment, seen in FIG. 4C, lower core leg surface 26 is not coextensive with lower core body surface 16. In this embodiment, a core leg thickness 25 is defined as the distance between upper and lower core leg surfaces 24, 26. Also, in this embodiment, core leg height 22 is defined as the distance between upper core leg surface 24 and lower core body surface 16. In this embodiment, both core leg thickness 25 and core leg height 22 are less than core body height 20.

As seen in FIG. 4B and FIG. 4C, core leg 15 has a reduced core leg height 22 as compared to core body height 20. When core leg height 15 is reduced in accordance with the present invention, it may be necessary in some applications and embodiments to increase the width of the core leg 15 to accommodate a desired magnetic flux pattern across the end surface of core leg 15. Thus, in some embodiments, as seen in FIG. 4B, core leg 15 has a core leg cross-sectional area 27 greater than the end leg cross-sectional area 28. In some embodiments, the core leg cross-sectional area is at least twice an end leg cross-sectional surface area 28. In additional embodiments, a core 12 having a core leg cross-sectional area is exactly two times the end leg cross-sectional surface area 28 provides an optimal magnetic flux path.

Referring again to FIG. 3 and FIG. 4A, in some embodiments a conductive winding 30 is positioned about core leg 15. Conductive winding 30 can include one or more turns of a conductive wire positioned around core leg 15. In some embodiments, the wire that forms conductive winding 30 is surrounded with an electrically insulating sheath to prevent electrical contact between adjacent turns of the wire. In other embodiments, the wire that forms conductive winding 30 is coated with an electrically insulating enamel to prevent electrical contact between adjacent turns of the wire about the core leg 15.

As seen in FIG. 4A, in some embodiments, the conductive winding 30 can be positioned about a bobbin structure 40. The bobbin structure 40 defines an axial opening 46, and the core leg 15 is disposed in the axial opening 46 of the bobbin structure 40. The axial opening 46 generally includes an axial opening height dimensioned to correspond to the core leg height 22 in embodiments where the lower core leg surface 26 is coextensive with the lower core body surface 16, as seen in FIG. 4B. In embodiments where the lower core leg surface 26 is not coextensive with the lower core body surface 16, the axial opening height is dimensioned to correspond to core leg thickness 25, seen in FIG. 4C. Axial opening 46 extends along the longitudinal axis of bobbin structure 40, and the conductive winding is wound about the bobbin structure in an orientation substantially transverse to the longitudinal axis of the bobbin structure 40. Bobbin structure 40 in some embodiments includes an electrically insulating material such as a polymer or a ceramic material in some embodiments.

Figure 5A:
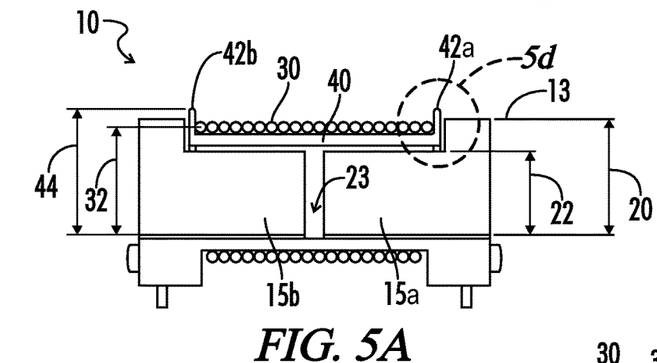
FIG. 5A illustrates a partial cross-sectional view of an embodiment of a magnetic component from FIG. 3.

Referring now to FIG. 5A, a partial cross-sectional view of an embodiment of a magnetic component 10 illustrating section 5A-5A from FIG. 3 is shown. Magnetic component 10 includes a first core having a first core leg 15a and a second core having a second core leg 15b. First and second core legs 15a, 15b are disposed in axial opening 46 of bobbin structure 40 such that first and second core legs 15a, 15b extend toward each other. In some embodiments, first and second core legs 15a, 15b contact each other at a location inside axial opening 46. In other embodiments, an air gap 23 can be defined between first and second core legs 15a, 15b, seen in FIG. 5A.

Figure 5B:
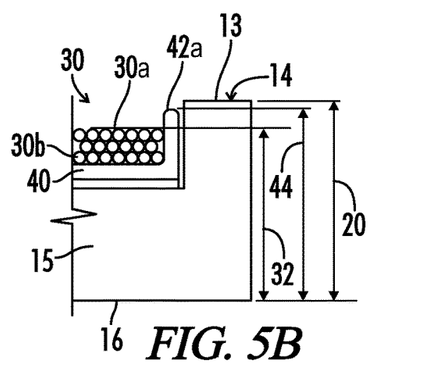
FIG. 5B illustrates a partial cross-sectional view of an embodiment of a magnetic component in accordance with the present invention.
Figure 5C:
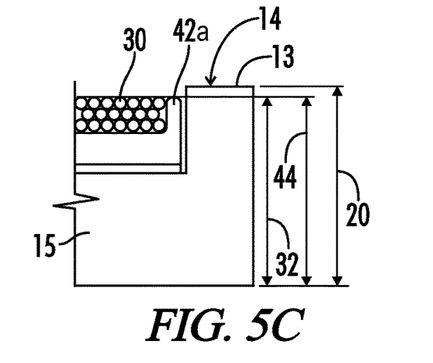
FIG. 5C illustrates a partial cross-sectional view of an embodiment of a magnetic component in accordance with the present invention.

As seen in FIG. 5B, when core leg 15 is received in bobbin structure 40, conductive winding 30 defines a winding height 32. The winding height 32 is generally defined as the height of the uppermost winding layer above the lower core surface 16. The winding 30 in some embodiments includes multiple winding layers positioned about the bobbin structure 40. For example, as seen in FIG. 5B, conductive winding 30 can include an outermost winding layer 30a and an innermost winding layer 30b, wherein the outermost winding layer 30a defines the winding height 32. In some embodiments, the innermost layer 30b is a primary winding and the outermost layer 30b is a secondary winding magnetically coupled to the primary winding via magnetic flux through the core 12. In other embodiments, outermost winding layer 30a is a primary winding and innermost layer 30b is a secondary winding. Conductive winding 30 defines a winding height offset ratio equal to the winding height 32 divided by the core body height 20. In some embodiments, the present invention provides a magnetic component having a winding height offset ratio being less than about 1.1. In an additional embodiment, it may be advantageous to provide a winding height offset ratio between about 1.0 and about 0.5. A winding height offset ratio equal to 1.0 provides a winding height that is coextensive with the upper core body surface 14. A winding height offset ratio less than 1.0 provides a winding height that is below upper core body surface 14, as seen in FIG. 5B and FIG. 5C. In some embodiments, a winding height offset ratio between about 1.0 and about 0.9 provides an optimal winding height offset for reducing the profile of the magnetic component 10 and also providing a substantially uniform upper surface of the magnetic component for positioning a thermal gap-filler.

Referring again to FIG. 3, FIG. 4A and FIG. 5A, in some embodiments, bobbin structure 40 includes one or more bobbin flanges protruding transversely from bobbin structure 40 at various axial locations. For example, a first bobbin end flange 42a can be positioned at an axial end of bobbin structure 40 surrounding axial opening 46. Similarly, a second bobbin end flange 42b can extend from the opposite axial end of bobbin structure 40. Each bobbin end flange 42a, 42b extends a distance above bottom core surface 16, as seen in FIG. 5A and FIG. 5B, defining a flange height 44. In some embodiments, first and second bobbin flanges 42a, 42b have the same flange height 44.

Figure 7A:
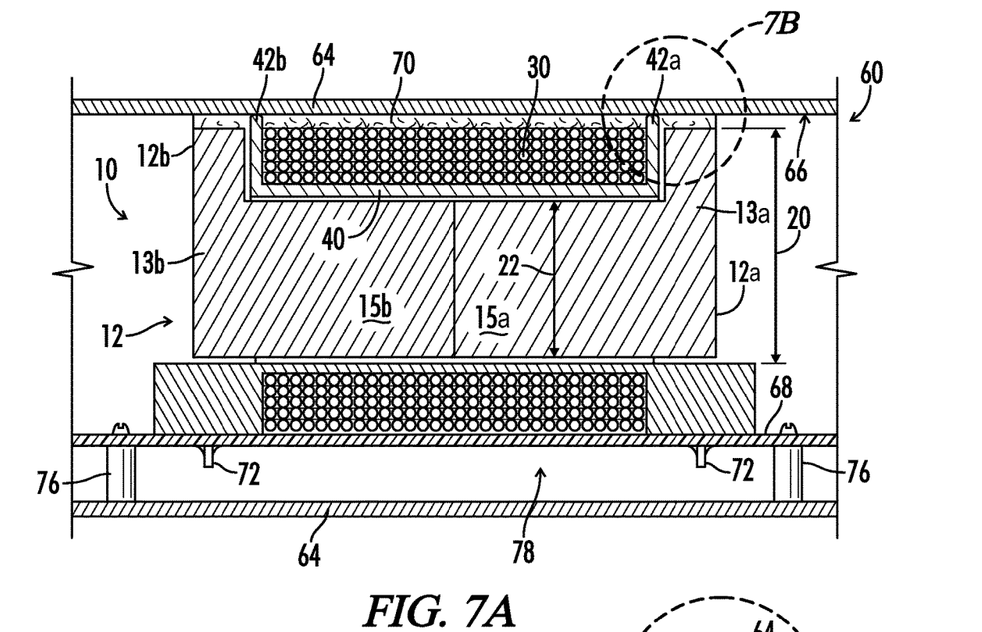
FIG. 7A illustrates a partial cross-sectional view of an embodiment of an electronic device including a magnetic component surrounded by an enclosure, the enclosure engaging the bobbin flange in accordance with the present invention.

Referring to FIG. 5B, bobbin end flange 42a defines a flange height offset ratio equal to the flange height 44 divided by the core body height 20. When the flange height offset ratio is greater than one, the bobbin end flange 42a extends above the upper core body surface 14. When the flange height offset ratio is equal to one, the bobbin end flange 42a is even with the upper core body surface 14. When the flange height offset ratio is less than one, the bobbin end flange 42a is below the upper core body surface 14. In some embodiments, the flange height offset ratio is between about 1.1 and about 0.9. In some embodiments, the flange height offset ratio is greater than one and the winding height offset ratio is less than one or equal to one, as seen in FIG. 5A and FIG. 7A, respectively. In these embodiments, the bobbin end flange 42a extends above the upper core body surface 14, and the winding 30 extends to a height equal to or less than the height of the upper core body surface 14.

Additionally, as seen in FIG. 5B and FIG. 5C, in some embodiments, the bobbin flange height 44 is less than the core body height 20, and the bobbin end flange 42a does not extend above the upper core body surface 14. In these embodiments, the winding height 32 can be either less than the bobbin flange height 44, as seen in FIG. 5B or equal to the bobbin flange height 44, as seen in FIG. 5C.

Figure 5D:
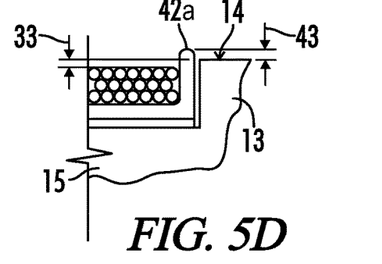
FIG. 5D illustrates a detail partial cross-sectional view of an embodiment of a magnetic component in accordance with the present invention.

Referring to FIG. 5D, in some embodiments, the distance the bobbin end flange 42a protrudes above the upper core body surface 14 defines a bobbin flange offset 43. In some embodiments, the bobbin flange offset 43 is between about 0.1 mm and about 5.0 mm. Similarly, the distance the winding 30 extends below the upper core body surface 14 defines a winding offset 33. The winding offset 33 in some embodiments can range between about 0.1 mm to about 5.0 mm.

It will be readily appreciated by those of skill in the art that, in some embodiments, the core leg height 22, seen in FIG. 4B can be dimensioned less than the core body height 20 such that a portion of winding 30 extends above upper core body surface 14. Such embodiments can advantageously reduce the distance conductive winding 30 extends above upper core body surface 14 in accordance with the present disclosure and should not be excluded from the scope of the present invention.

Figures 6, 7B:
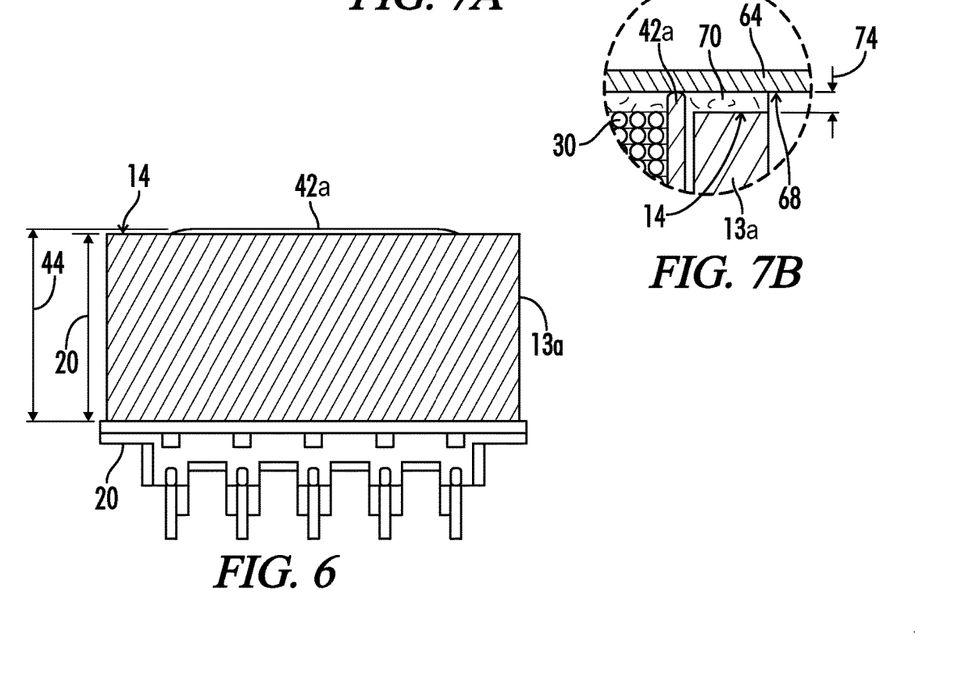
FIG. 6 illustrates an end elevation view of an embodiment of a magnetic component in accordance with the present invention.
FIG. 7B illustrates a detail partial cross-sectional view of the embodiment of an electronic device of FIG. 7A.

Referring now to FIG. 6, an end view of a magnetic component illustrates a core body 13a positioned on a bobbin structure 20 and dimensioned with a core body height 20 less than bobbin flange height 44. Thus, bobbin end flange 42a can extend a small distance above upper core body surface 14.

Referring now to FIG. 7A, in some embodiments the present invention provides an electronic device 60 including a circuit board 68 and a magnetic component 10 mounted on the circuit board 68. The magnetic component 10 and circuit board 68 are housed within an enclosure 64. Enclosure 64 can include a rigid box-type structure for protectively covering the circuit components mounted on circuit board 68. In some embodiments, enclosure 64 includes a plastic or metal enclosure. Enclosure 64 can further include one or more individual panels joined to form the enclosure structure. It is understood that enclosure 64 need not completely surround the circuit board 68 or magnetic component 10 and may include one or more recesses, vents, holes or ports defined therein.

Magnetic component 10 includes a core 12 and a conductive winding 30 disposed about the core. In some embodiments, the core includes first and second core sections 12a and 12b. A core section 12a includes a core body 13a defining a core body height 20 and a core leg 15a extending from the core body 13a. Core leg 15a defines a core leg height 22. Core leg height 22 is less than core body height 20. Bobbin structure 40 defines an axial opening, and the core leg 15 is positioned in the axial opening. A conductive winding 30 is disposed about the bobbin structure 40. Conductive winding 30 defines a winding height, and the winding height is less than the core body height.

The magnetic component 10 can be positioned on the circuit board such that the conductive winding 30 is electrically connected to an electronic circuit positioned on the circuit board 68. Circuit board 68 can be secured to the enclosure 64 using one or more mechanical fasteners such as screws, bolts, rivets, snap connectors. In some embodiments, one or more standoffs 76 can be used to physically distance circuit board 68 from enclosure 64, creating a standoff gap 78 between the circuit board 68 and the enclosure 64. In some embodiments, circuit components mounted on circuit board 68 extend into standoff gap 78.

The bobbin structure 40 is attached to the circuit board 68 using one or more terminal connectors 72 protruding from the bobbin structure. Each terminal connector 72 can include a conductive wire that is electrically and mechanically attached to conductive winding 30. Each terminal connector 72 can pass through a terminal via defined in the circuit board 68. Each terminal connector 72 can be soldered to a corresponding terminal pad on the circuit board 68. Each terminal connector 72 can also be inserted through a terminal via defined in circuit board 68 using a press-fit, a friction fit, or an interference fit to mechanically and electrically connect bobbin structure 40 and conductive winding 30 to circuit board 68.

Also seen in FIG. 7A, bobbin structure 40 includes first and second bobbin end flanges 42a, 42b extending above core body 13. In some embodiments, seen in FIG. 7A and FIG. 7B, enclosure 64 defines an interior enclosure surface 66 substantially facing upper core surface 14. The interior enclosure surface 66 in some embodiments contacts first and second bobbin end flanges 42a, 42b when enclosure 64 is fully-seated against magnetic component 10, providing a substantially uniform core gap between upper core body surface 14 and interior enclosure surface 66. This core gap can be filled with a thermally conductive gap-filler material 70 disposed between the magnetic component 10 and the interior enclosure surface 66. Heat generated in magnetic component 10 can pass through thermally conductive gap-filler 70 to enclosure 64 where the heat can be dissipated into the surrounding environment or to the ambient. Because the enclosure 64 generally includes a relatively larger surface area as compared to the surface area of magnetic component 10 or core 12, heat dissipation from magnetic component 10 can be enhanced by thermally coupling the magnetic component 10 directly to the enclosure wall using thermally conductive gap-filler 70. In some embodiments, air gap 23 is located at the longitudinal midpoint between first and second bobbin end flanges 42a, 42b. Thermally conductive gap-filler 70, also referred to as a thermal bridge, can also be positioned between conductive winding 30 and interior enclosure surface 66, as seen in FIG. 7B. An insulating tape or other intermediate layer can be positioned between thermally conductive gap-filler 70 and conductive winding 30.

Thermally conductive gap-filler 70 can include a conventional thermal bridge material suitable for providing a heat flux path between magnetic component 10 and enclosure 64. Such thermally conductive gap-filler materials can include solid or foam materials. For example, thermally conductive gap-filler 70 can include a compressible foam material. In some embodiments, the thermally conductive gap-filler has a thermal conductivity greater than about 0.2 W/(m-K).

In other embodiments, thermally conductive gap-filler 70 can include a gel impregnated with heat transfer particles such as boron nitride, carbon nanoparticles, carbon nanotubes, carbon fibers or other suitable particles known in the art. In other embodiments, thermally conductive gap-filler 70 can include a thermal interface material adhered to a location on the interior enclosure surface 66 that corresponds to the location of the magnetic component 10. In some embodiments, the thermally conductive gap-filler 70 can include a thermal grease, thermal gel, thermal paste, or non-solid heat transfer compound. Additionally, thermally conductive gap-filler 70 can include a ceramic-based thermal grease, a metal-based thermal grease, a carbon-based thermal grease.

Thermally conductive gap-filler 70 can include a material having a thermal conductivity between about 0.2 W/(m-K) and about 2000 W/(m-K). In some embodiments, thermally conductive gap-filler 70 includes a material having a thermal conductivity between about 0.2 W/(m-K) and about 400 W/(m-K) in the direction normal to the interior enclosure surface 66.

Figure 8A:
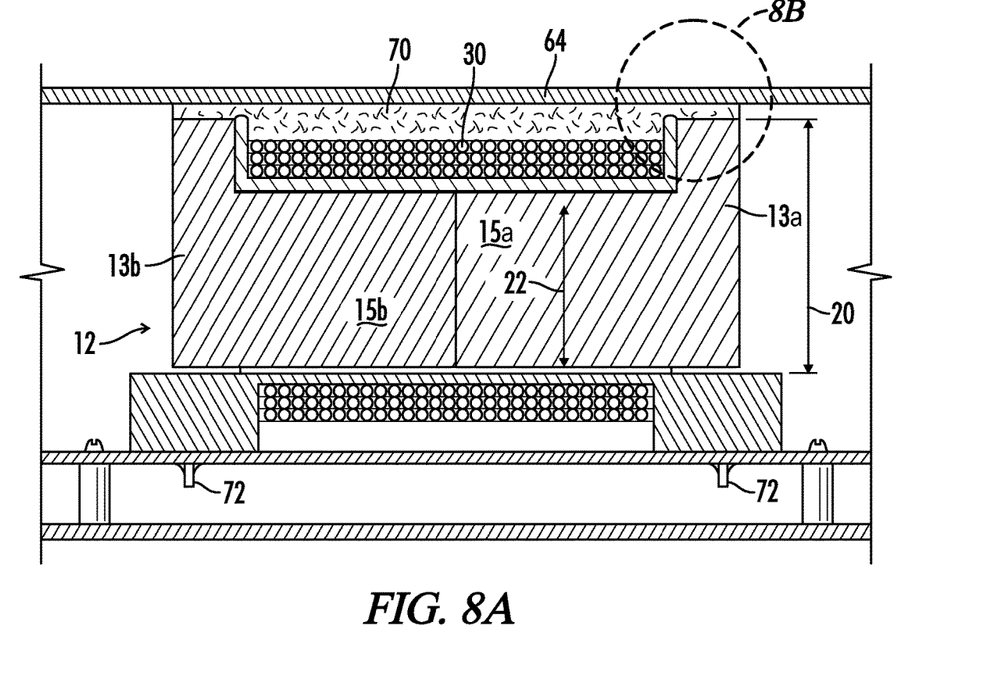
FIG. 8A illustrates a detail partial cross-sectional view of an embodiment of an electronic device including a magnetic component surrounded by an enclosure in accordance with the present invention.
Figure 8B:
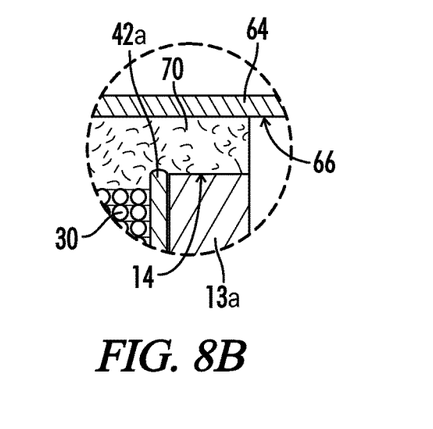
FIG. 8B illustrates a detail partial cross-sectional view of the embodiment of an electronic device of FIG. 8A.

In the embodiments seen in FIG. 7A and FIG. 7B, the bobbin end flanges 42*a*, 42*b* contact the interior enclosure surface 66 and can provide support between enclosure 64 and magnetic component 10 while preventing enclosure interior surface 66 from directly contacting core 12 or conductive winding 30. However, in other embodiments, as seen in FIG. 8A and FIG. 8B, the interior enclosure surface 66 does not directly engage any structure on magnetic component 10 and a gap is defined between upper core body surface 14 and interior enclosure surface 66. Thermally conductive gap-filler 70 can be disposed in this gap between magnetic component 10 and enclosure 64.

In some embodiments, the thermally conductive gap-filler 70 is applied to interior enclosure surface 66 before the enclosure wall is positioned adjacent magnetic component 10. In these embodiments, the reduced and uniform gap between interior enclosure surface 66 and magnetic component 10 makes application of the thermally conductive gap-filler to the enclosure wall easier because a thermally conductive gap-filler having a uniform thickness can be used.

Also, as seen in FIG. 7A and FIG. 8A, a reduced amount of thermally conductive gap-filler can be used as compared to conventional electronic device configurations that include a magnetic component with a core having equal core leg and core body heights, as seen in FIG. 1 and FIG. 2. By reducing the height of core leg 15 in accordance with the present invention, a smaller amount of thermally conductive gap-filler can be disposed between the magnetic component and the enclosure wall, thereby reducing the thermal resistance and improving heat dissipation. An added benefit of the reduction in core leg height is the ability to reduce the distance between the circuit board 68, thereby reducing electronic device profile.

In further embodiments, the present invention provides a method of forming an electronic device. The method includes the step of providing a magnetic component having a core body and a core leg protruding from the core body. The core leg has a core leg height and the core body defines a core body height, the core leg height being less than the core body height. The method also includes the step of positioning a conductive winding about the core leg. The conductive winding can be positioned directly onto the core leg or can be wound onto a bobbin structure that is positioned on the core leg. Another step includes positioning the magnetic component in an enclosure having an interior enclosure surface. The method also includes the step of disposing a thermally conductive gap-filler material between the interior enclosure surface and the magnetic component. In some embodiments, the thermally conductive gap-filler includes a compressible foam having a thermal conductivity greater than about 0.2 W/(m-K) in the direction normal to the interior enclosure surface 66.

Thus, although there have been described particular embodiments of the present invention of a new and useful LOW PROFILE MAGNETIC COMPONENT APPARATUS AND METHODS it is not intended that such references be construed as limitations upon the scope of this invention except as set forth in the following claims.

What is claimed is:

1. A magnetic component apparatus for an electronic circuit, comprising:
   a core having a core body and a core leg protruding from the core body;
   the core body defining a core body height;
   the core leg defining a core leg height, the core leg height being less than the core body height; and
   a conductive winding positioned about the core leg, the conductive winding defining a winding height, the conductive winding also defining a winding height offset ratio equal to the winding height divided by the core body height, the winding height offset ratio being less than about 1.1,
   wherein the winding height offset ratio being between about 1.0 and about 0.5.

2. A magnetic component apparatus for an electronic circuit, comprising:
   a core having a core body and a core leg protruding from the core body;
   the core body defining a core body height;
   the core leg defining a core leg height, the core leg height being less than the core body height; and
   a conductive winding positioned about the core leg, the conductive winding defining a winding height, the conductive winding also defining a winding height offset ratio equal to the winding height divided by the core body height, the winding height offset ratio being less than about 1.1,
   wherein the winding height offset ratio being between about 1.0 and about 0.9.

3. A magnetic component apparatus for an electronic circuit, comprising:
   a core having a core body and a core leg protruding from the core body;
   the core body defining a core body height;
   the core leg defining a core leg height, the core leg height being less than the core body height;
   a conductive winding positioned about the core leg, the conductive winding defining a winding height, the conductive winding also defining a winding height offset ratio equal to the winding height divided by the core body height, the winding height offset ratio being less than about 1.1
   a bobbin structure defining an axial opening, the conductive winding disposed about the bobbin structure; and
   the core leg disposed in the axial opening of the bobbin structure, the bobbin structure including a bobbin end flange positioned at an axial end of the bobbin structure, the bobbin end flange defining a flange height, the bobbin end flange defining a flange height offset ratio equal to the flange height divided by the core body height,
   wherein the flange height offset ratio is between about 1.1 and about 0.9.

4. A magnetic component apparatus for an electronic circuit, comprising:

a core having a core body and a core leg protruding from the core body;

the core body defining a core body height;

the core leg defining a core leg height, the core leg height being less than the core body height;

a conductive winding positioned about the core leg, the conductive winding defining a winding height, the conductive winding also defining a winding height offset ratio equal to the winding height divided by the core body height, the winding height offset ratio being less than about 1.1;

a bobbin structure defining an axial opening, the conductive winding disposed about the bobbin structure; and the core leg disposed in the axial opening of the bobbin structure, the bobbin structure including a bobbin end flange positioned at an axial end of the bobbin structure, the bobbin end flange defining a flange height, the bobbin end flange defining a flange height offset ratio equal to the flange height divided by the core body height, wherein the bobbin end flange defines a flange offset distance equal to the distance the bobbin end flange projects above the core body, the flange offset being between about 0.1 mm and about 5.0 mm.

5. A magnetic component apparatus for an electronic circuit, comprising:

a core having a core body and a core leg protruding from the core body;

the core body defining a core body height;

the core leg defining a core leg height, the core leg height being less than the core body height;

a conductive winding positioned about the core leg, the conductive winding defining a winding height, the conductive winding also defining a winding height offset ratio equal to the winding height divided by the core body height, the winding height offset ratio being less than about 1.1;

a bobbin structure defining an axial opening, the conductive winding disposed about the bobbin structure;

the core leg disposed in the axial opening of the bobbin structure, the bobbin structure including a bobbin end flange positioned at an axial end of the bobbin structure, the bobbin end flange defining a flange height, the bobbin end flange defining a flange height offset ratio equal to the flange height divided by the core body height, an enclosure surrounding the core and the bobbin structure, the enclosure including a circuit board housed therein; and the bobbin structure mounted on the circuit board.

6. The apparatus of claim 5, further comprising:

the core body including an upper core body surface, the enclosure defining an interior enclosure surface substantially facing the upper core body surface; and the interior enclosure surface defining a core gap between the upper core body surface and the interior enclosure surface.

7. The apparatus of claim 6, further comprising a thermally conductive gap-filler disposed in the core gap.

8. The apparatus of claim 7, further comprising the winding height offset ratio being less than about 1.0.

9. The apparatus of claim 7, further comprising:

the flange height offset ratio being greater than about 1.0; and the winding height offset ratio being less than about 1.0.

10. The apparatus of claim 7, further comprising:

the flange height offset ratio being greater than about 1.0; and the winding height offset ratio being substantially equal to about 1.0.

11. The apparatus of claim 7, further comprising the flange height offset ratio being equal to about 1.0.

12. The apparatus of claim 7, further comprising:

the flange height offset ratio being less than about 1.0; and the winding height offset ratio being less than about 1.0.

13. The apparatus of claim 7, further comprising:

the flange height offset ratio being between about 1.0 and about 1.1; and the winding height offset ratio being between about 1.0 and about 0.9.

* * * * *